United States Patent
Akatsu et al.

[11] Patent Number: 5,934,299
[45] Date of Patent: Aug. 10, 1999

[54] APPARATUS AND METHOD FOR IMPROVED WASHING AND DRYING OF SEMICONDUCTOR WAFERS

[75] Inventors: Hiroyuki Akatsu, Yorktown Heights; Ravikumar Ramachandran, Beacon, both of N.Y.

[73] Assignees: Siemens Aktiengesellschaft, Munich, Germany; International Business Machines Corporation, Armonk, N.Y.

[21] Appl. No.: 09/095,985

[22] Filed: Jun. 11, 1998

Related U.S. Application Data

[62] Division of application No. 08/939,547, Sep. 29, 1997, Pat. No. 5,807,439.

[51] Int. Cl.$^6$ .................................................. B08B 3/00
[52] U.S. Cl. ........................ 134/105; 134/133; 134/144; 134/155; 134/902
[58] Field of Search .................. 134/133, 144, 134/155, 172, 177, 95.2, 61, 135, 902, 186, 105; 34/77, 78

[56] References Cited

U.S. PATENT DOCUMENTS

| | | | |
|---|---|---|---|
| 4,984,597 | 1/1991 | McConnel et al. | 134/95 |
| 5,443,540 | 8/1995 | Kamikawa | 34/471 |
| 5,464,480 | 11/1995 | Matthews | 134/1.3 |
| 5,520,744 | 5/1996 | Fujikawa et al. | 134/11 |
| 5,540,245 | 7/1996 | Munakata et al. | 134/76 |
| 5,569,330 | 10/1996 | Schild et al. | 134/1 |
| 5,575,079 | 11/1996 | Yokomizo et al. | 34/78 |
| 5,660,642 | 8/1997 | Britten | 134/30 |
| 5,714,203 | 2/1998 | Schellenberger | 427/378 |
| 5,752,532 | 5/1998 | Schwenkler | 134/102.3 |
| 5,807,439 | 9/1998 | Akatsu et al. | 134/32 |

*Primary Examiner*—Frankie L. Stinson
*Assistant Examiner*—Paul J. Lee
*Attorney, Agent, or Firm*—Stanton C. Braden

[57] ABSTRACT

Apparatus and method are provided for improved washing and drying of semiconductor wafers utilizing an enhanced "Marangoni effect" flow of liquid off of the wafers for superior prevention of watermarks (water spots) on integrated circuits (ICs) on the wafers. The apparatus includes a housing 12 which may be hermetically sealed, an open-top wash tank 60 within a lower part of the housing, a moveable rack 16 for holding the wafers either in the tank for washing or in an upper part of the housing for drying, apparatus 34 for supplying chilled (near freezing) de-ionized water (DIW) to a lower part of the tank, the DIW flowing within the tank and overflowing the top thereof, a pump 20 for draining overflowing DIW from the housing, and apparatus 40 for supplying to the housing organic vapor such as isopropyl alcohol (IPA) in a dry gas such as nitrogen. During wafer drying operation of the apparatus the pressure within the housing is kept at about one Torr or less.

9 Claims, 1 Drawing Sheet

APPARATUS AND METHOD FOR IMPROVED WASHING AND DRYING OF SEMICONDUCTOR WAFERS

This is a divisional, of application Ser. No. 08/939,547 filed Sep. 29, 1997, now U.S. Pat. No. 5,807,439.

FIELD OF THE INVENTION

This invention relates to improved apparatus and method for washing and then drying of semiconductor wafers during processing into integrated circuits (ICs) so as to reduce or suppress the occurrence of watermarks (or water spots), such watermarks or water spots being one of the chief causes of defects in high density ICs.

BACKGROUND OF THE INVENTION

When a semiconductor wafer is processed into integrated circuits (ICs), it is necessary to thoroughly wash the wafer in order to remove residual chemicals, small particles and other contaminants which occur during various steps of processing. It is important that the face of the wafer be washed ultra-clean so that even microscopic traces of contaminants are completely removed.

There are a number of semiconductor wafer washing and drying systems commercially available. The present invention is applicable to those systems which utilize de-ionized water (DIW) in combination with an organic vapor such as isopropyl alcohol (IPA) in an atmosphere such as dry nitrogen. Such a system washes and dries a wafer or wafers in accordance with the "Marangoni effect" which will be further described hereinafter.

As is well known, when a semiconductor wafer is processed into ICs, a face of the wafer is contoured into microscopically fine details with trenches, and plateaus lines, holes, etc. As the ICs become denser and denser, these surface details become smaller. For example in the case of a high-density DRAM (dynamic random access memory), the trenches in the silicon face of the wafer between capacitor stacks may be finer than one-half micron. Water washing liquid, such as de-ionized water (DIW) collects in these trenches and on other surface details and is hard to remove completely because of capillary action of the wafer-washing liquid.

De-ionized water (DIW) is an aggressive solvent and will even dissolve small amounts of the silicon of a wafer. Thus, if after washing of the wafer, even small amounts of DIW are trapped in trenches or on other surface details of ICs on the wafer, small amounts of silicon are dissolved into the DIW. When this trapped DIW is subsequently dried by evaporation, silicon compounds are left behind as deposits commonly called watermarks (mostly from DIW but partly from DIW mixed with IPA on the surface of the wafer). These watermarks, in turn, lead to defects in the ICs. It is highly desirable therefore that the washing and drying of a semiconductor wafer be such that even small amounts of DIW be removed from the surface details of the ICs before watermarks can be formed. A further discussion of watermarks is to be found in an article entitled "Effects of Drying Methods and Wettability of Silicon on the Formation of Water Marks in Semiconductor Processing," by Jin-Goo Park and Michael F. Pas, pages 2028–2031, Journal Electrochemical Society, Vol. 142, No. 6, June 1995.

When a semiconductor wafer, held vertical, is slowly drawn out of a tank of wash water (e.g., DIW), there is a meniscus of water at the face of the wafer. The meniscus forms a thin zone of water vertically against the face of the wafer; this zone rises slightly above the top surface level of the main body of water in the tank. This is a well known phenomenon. If the surface of the water is also exposed to an organic vapor, such as IPA in dry nitrogen, molecules of the vapor continually diffuse into the water. These molecules are concentrated to a much greater extent at or near the surface of the water than deeper into it. Thus the thin zone of the water meniscus against the face of the wafer has a very much higher concentration of organic molecules (IPA) than does the main body of water (DIW) in the tank.

Isopropyl alcohol (IPA) has a lower surface tension (ST) than does de-ionized water (DIW). For example, at 20° C. the ST of IPA is about 21 dynes/cm, whereas the ST of DIW is about 72 dynes/cm. Because of this fact there is a differential between the lowered surface tension (ST) of the liquid (DIW plus high concentration of IPA) in the zone of the meniscus at the surface of the wafer and the higher surface tension (ST) of the main body of wash water (DIW alone). As a result of this differential of STs, there is a flow of liquid internally from the zone of the meniscus into the main body of water. This is called the "Marangoni effect" and is well known in the art (see for example, U.S. Pat. No. 5,569,330, dated Oct. 29, 1996, and U.S. Pat. No. 5,571,337, dated Nov. 5, 1996). By using the "Marangoni effect", water is more efficiently removed from the face of a wafer than otherwise. Wafer washing and drying apparatus utilizing the "Marangoni effect" is commercially available.

The present invention provides improved apparatus and method for washing and drying semiconductor wafers utilizing liquid flow offof the wafer by means of an enhanced "Marangoni effect". This, in combination with other features of the invention, provides substantially better prevention of watermarks than do previous systems.

SUMMARY OF THE INVENTION

In one apparatus aspect, the present invention is directed to apparatus for washing and drying of semiconductor wafers. The apparatus comprises a housing means, a moveable means, means for supplying organic vapor to the housing means, and means for supplying wafer-washing water to the housing means. The housing means is designed to contain at least one wafer during washing and drying and has a lower portion designed to contain wafer-washing water and has an upper portion designed to contain an organic vapor. The moveable means is within the housing means and holds the wafer submerged in wafer-washing water while same is being washed and then lifts the wafer out of the water and into the upper portion of the housing means where the wafer can be exposed to the organic vapor. The wafer-washing water is substantially cooled below ambient temperature such that the wafer when lifted out of the wafer-washing water into the upper portion of the housing means is quickly dried and watermarks on the wafer are substantially eliminated.

In one method aspect, the present invention is directed to a method for washing and drying of a semiconductor wafer with integrated circuits (ICs) formed therein. The method utilizes a "Marangoni effect" flow and comprises a first step of washing the wafer in a chilled body of de-ionized water (DIW); a second step of raising the wafer out of the body of DIW for wafer drying; and a third step of exposing the body of DIW and the surface of the wafer as it is being raised out of the DIW to an organic vapor under controlled pressure, the organic vapor in liquid form having a lower surface tension than that of DIW such that as the wafer is raised out of the body of DIW there is on the surface of the wafer a meniscus of DIW with organic vapor absorbed therein and fluid flows by "Marangoni effect" down off of the surface of the wafer into the body of DIW whereby the formation of watermarks on the ICs of the wafer is substantially eliminated.

A better understanding of the invention will best be gained from a study of the following description given in conjunction with the accompanying drawings and claims.

DETAILED DESCRIPTION

Figure 1:
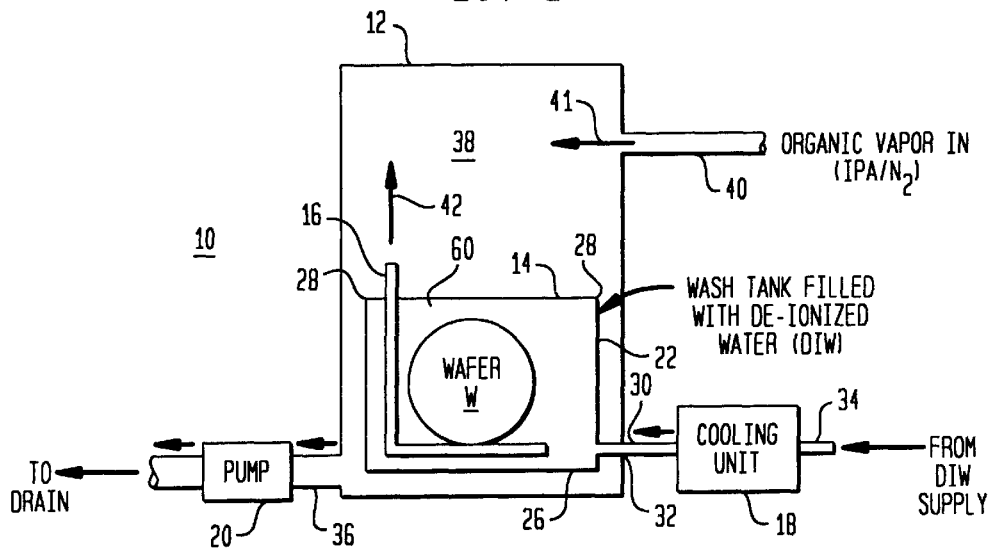
FIG. 1 is a schematic representation of apparatus for washing and drying semiconductor wafers in accordance with the present invention.

FIG. 1 shows a schematic form, by way of example, of a cross-section of an apparatus 10 in accordance with the present invention. Apparatus 10 facilitates washing and drying of one or more semiconductor wafers W, with the wafers W being substantially free of watermarks (water spots) after drying. The apparatus 10 comprises an airtight housing 12, a wash tank 14, a wafer holding and lifting rack 16, a water cooling unit 18, and a pump 20. Other elements of the apparatus 10, or within the housing 12, are not shown but may be such as found with similar apparatus commercially available. One such apparatus is sold by Dai Nippon Screen (DAS) Co. of Japan.

Illustratively, the wash tank 14 is three dimensional in shape with four vertical walls 22, a bottom 26, no top, and a top lip 28. The tank 14 is continuously filled with de-ionized water (DIW) 60 via a supply pipe 30 through one tank wall 22 near the bottom 26 of the tank 14. There is an hermetic seal 32 around the pipe 20 where it passes through a wall of the housing 12 to the tank 14. The pipe 30 runs to the water cooling unit 18 which in turn is supplied via a pipe 34 from a DIW supply (not shown). Cold (chilled) DIW 60 close to freezing temperature (e.g., at about 50° C.), running into the bottom of the tank 14 continuously flows upward within the tank and drains out of the tank over its top lip 28. We have discovered that the use of cold water enhances the "Marangoni effect" and results in a substantial reduction in watermarks being left on the wafers W as a result of the washing and drying process. The water overflowing the tank 14 falls to the bottom of the housing 12 and is pumped out via a drain pipe 36 and the pump 20. The tank 14 is deep enough so that when the wafer rack 16 is in its down position as seen in FIG. 1, the wafers W are completely submerged in DIW washing upward over and around them.

The housing 12 is hermetically sealed when apparatus 10 is in operation. The interior of the housing 12 during wafer-washing is maintained at atmospheric pressure. During wafer drying the interior of the housing 12 is maintained at a low pressure. This low pressure is typically a fraction of a Torr and can be from about one Torr or less. The interior of the housing 12 above the tank 14 comprises a space 38 which is continuously supplied with an organic vapor such as IPA in dry nitrogen via a pipe 40, as indicated by an arrow 41. The pipe 40 is connected to a supply (not shown).

To suppress IPA condensation in the vessel containing the chilled DIW, the temperature of the IPA/$N_2$ mixture may be reduced as it is introduced into the process chamber. The temperature is reduced to equal or less than about the temperature of the DIW. In one embodiment, the temperature of the IPA/$N_2$ mixture is reduced by chilling the $N_2$ gas and/or the IPA vaporizer. By lowering the temperature of the mixture, the IPA concentration may be maintained less than the saturation value. By this method, even though the chamber temperature is reduced due to the presence of chilled DIW, condensation of IPA in the tank may be suppressed. The $N_2$ and/or the vaporizer can be chilled using the same cooler to chill the DIW. As such, no additional hardware is necessary for the chilled $N_2$/IPA supply.

After the wafers W have been sufficiently washed in DIW 60 (e.g., during an elapsed time of 10 to 20 minutes), the rack 16 and the wafers W held thereby are raised within the sealed housing 12. A mechanism (not shown) raises wafers and rack at a controlled rate (e.g., over an elapsed time of 5 to 10 minutes) vertically from the down position shown until they are entirely out of the wash tank 14, as indicated by a vertical arrow 42. Only after the wafers are entirely out of the wash tank 14 is the pressure in the housing 12 reduced to low value such as mentioned above.

As the wafers W are gradually raised by the holder 16 above the top lip 28 (water level) of the tank 14, the wafers W become exposed to IPA vapor molecules in the upper space 38 of the housing 12 (still at atmospheric pressure) and, in accordance with one feature of the invention, enhanced "Marangoni effect" fluid flow takes place. The flow is a convection current of DIW with absorbed IPA molecules down away from and off of the face of the wafers W into the wash water. This enhanced action, together with other features of the invention, substantially eliminates the formation of watermarks on the wafers W after dying, as will now be explained.

Figure 2:
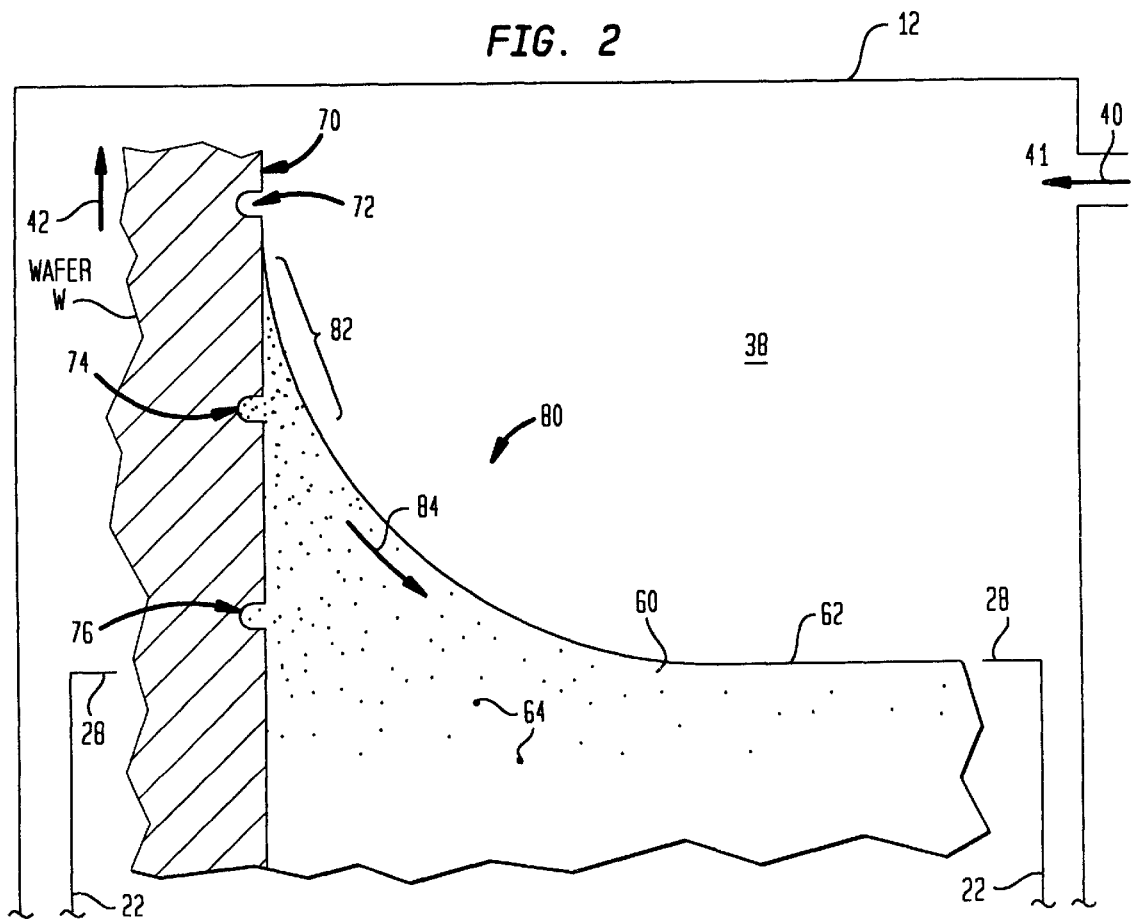
FIG. 2 is a greatly enlarged schematic representation showing in cross-section a portion only of a semiconductor wafer as it is being withdrawn vertically from a body of wash water contained in the apparatus of FIG. 1.

Referring to FIG. 2, there is shown a greatly enlarged schematic representation of a portion of apparatus 10 of FIG. 1 with a semiconductor wafer W therein being pulled out of tank 14 and into space 38 at the top of housing 12. The wafer W is being withdrawn generally vertically from the wash tank 14 (see FIG. 1) at a controlled rate in the direction of the arrow 42 from a body of wash water (DIW) 60 in the tank 14. A top surface 62 of the DIW 60 is level with the tank lip 28. As was mentioned previously, the space 38 within the upper part of the housing 12 is continuously supplied with organic vapor (IPA/$N_2$), and molecules of the vapor, indicated by "dots" 64, are absorbed into the DIW 60. There is much higher concentration of the organic molecules 64 at and near the surface 62 of the DIW 60 than deeper into it. The continuous flow of the DIW 60 up and over the tank lip 28 helps keep the organic molecules 64 concentrated near the water surface 62.

A front face 70 of the wafer W is shown partially in and partially out of the DIW wash water 60 of the tank 14. A rear face and other portions of the wafer W are broken away and not shown. The wafer face 70 is configured into ICs (as is well known in the art). By way of example, three "trenches", an upper trench 72, a middle trench 74, and a lower trench 76 are shown etched into the face 70 of the wafer W to illustrate surface details of the ICs (other details being not shown). The trenches 72, 74 and 76 are microscopically small in size (less than one micron). DIW wash water 60 flows by capillary action into the trenches 72, 74 and 76 (and on other surface details of the ICs not shown) during washing of the wafer W. It is important that all such water which may remain after washing be expeditiously removed from these trenches (and from other such surface details) on the face 70 of the wafer W as it is removed from the wash tank 14 in order to preclude the formation of watermarks, as was explained previously.

The vertical face 70 of the wafer W, as it is drawn upward, is in contact with a meniscus generally indicated at 80, of DIW 60. An upper, thin zone 82 of the meniscus 80 is rich in absorbed molecules 64 of IPA as indicated by the high concentration of "dots" representing these molecules. On the other hand, lower down along the meniscus 80 the concentration of IPA molecules 64 is much less because of, among other reasons, the continuous flow of DIW 60 up and over the tank lip 28, as was explained previously.

The surface tension (ST) of liquid IPA is less than the surface tension of DIW. Thus where there is a high concentration of IPA molecules 64 in the DIW 60, as in the meniscus zone 82, the surface tension (ST) of the liquid mixture is lower than the ST of DIW alone. This differential in STs gives rise to an internal flow of liquid, indicated by an arrow 84, from a region of lower ST (zone 82) to a region of higher ST (the main body of DIW 60). Such internal liquid flow is termed the "Marangoni effect".

As was mentioned previously DIW 60 supplied to the tank 14 is chilled to near freezing (e.g., 50° C.) by the cooling unit 18. The wafer W as it is withdrawn from the DIW 60 is thus relatively cold. This promotes the condensation of IPA vapor on the exposed face 70 of the wafer W. And this condensed IPA continuously flows down the face of the wafer further concentrating IPA molecules 64 in the meniscus zone 82. Moreover, as DIW is cooled to near freezing, as here, its ST increases faster than the ST of IPA as it is cooled. Thus the differential in STs between DIW mixed with IPA and DIW alone is in fact increased by the cold temperature here compared to ambient of about 20° C. This feature of the invention enhances the "Marangoni effect". Also, because DIW is less active as a solvent at lower temperature (e.g., 50° C.) than at ambient or higher temperatures, smaller amounts of silicon of the wafer W are dissolved by the DIW. This further inhibits the formation of watermarks. While the wafer W is immersed in the DIW 60, the continuous flow of wash water up and over the wafer flushes away any DIW with dissolved silicon (or other contaminants) in it.

As indicated schematically in FIG. 2, the lower trench 76 in the face 70 of the wafer W is below water level and is filled with almost pure DIW. The middle trench 74 however, is in the thin meniscus zone 82 where the DIW is rich in IPA molecules 64, as was previously explained. The trench 74 accordingly is filled with liquid (DIW with a high concentration of IPA) which has a lower ST than DIW alone. Accordingly, as the wafer W is further raised above the meniscus 80 and the zone 82, liquid in the trench 74 will be drawn in the direction of the arrow 84 by the "Marangoni effect" out of and down away from the trench 74 leaving it free of DIW. Such a liquid-free condition is illustrated in FIG. 2 for the upper trench 72 which is shown already above the meniscus 80.

Any microscopic amounts of DIW which may still remain in the trenches 72, 74, 76, or on other surface details of the wafer W after it has been completely withdrawn from the tank 14 are quickly evaporated as will now be explained. As soon as the wafers W are completely out of the wash water in the tank 14 (i.e., entirely above the top surface 62 of the DWI 60) the supply of organic vapor (IPA/N$_2$) to the housing 12 via the pipe 40 is turned off. At the same time the pump 20 is operated at a rate to quickly reduce the pressure within the housing 12 and the upper space 38 to less than about one Torr. At this low pressure any residual DIW (and IPA) on a wafer W quickly evaporates. This considerably shortens the time during which such residual DIW can dissolve silicon from the body of the wafer and thereby subsequently leave watermarks after drying. Also because the residual DIW and wafer W are cold (e.g., near freezing) any residual DIW is further inhibited in dissolving silicon from the wafer. Low pressure, shortened time and cold temperature here all contribute to virtually zero incidence of watermarks. Thus the apparatus 10 provides improved washing and drying of semiconductor wafers W and insures substantially better prevention of watermarks than do previous systems.

Various modifications in the apparatus and method disclosed may occur to those skilled in the art and can be made without departing from the spirit and scope of the invention as set forth in the accompanying claims. For example, the temperature and pressure values mentioned can be changed, and the washing and drying times for particular wafers may be as best suited for them. Moreover, organic vapor other than IPA in nitrogen can be used.

What is claimed is:

1. Apparatus for washing and drying of semiconductor wafers during processing thereof into integrated circuits (ICs), the apparatus comprising:

a housing having upper and lower portions;

a wash tank located in the lower portion of the housing with a top portion of the tank being open to the upper portion of the housing;

water supply means for supplying de-ionized water (DIW) to the tank, the DIW flowing continuously into and up and overflowing the top of the tank, the DIW washing a wafer or wafers submerged in the tank;

cooling means for chilling to about 5° C. the DIW washing the wafers;

a rack within the housing for holding the wafers, the rack being moveable and having a down position in which the wafers are submerged in the DIW for washing and having an up position in which the wafers are in the upper portion of the housing and entirely out of the DIW in the wash tank for drying;

means for raising the rack from its down position to its up position, the rate of raising being selected such that surface details of the ICs can be substantially entirely freed of trapped DIW; and vapor means for supplying organic vapor to the upper portion of the housing, the vapor being of an organic liquid which has a lower surface tension than the surface tension of DIW, the DIW being drawn down away from surface details of the ICs by an enhanced "Marangoni effect" fluid flow when the wafers are raised by the rack out of the DIW in the wash tank and the formation of watermarks is substantially eliminated.

2. Apparatus for washing and drying of semiconductor wafers during processing thereof into integrated circuits (ICs) having fine surface details, the apparatus comprising:

a housing having upper and lower portions, the housing being hermetically sealed during drying of the wafers;

a wash tank located in the lower portion of the housing with a top portion of the tank being open to the upper portion of the housing;

water supply means for supplying de-ionized water (DIW) to the tank, the DIW flowing continuously into and up and overflowing the top of the tank, the DIW washing a wafer or wafers submerged in it;

cooling means for chilling to about 5° C. the DIW washing the wafers;

a rack within the housing for holding the wafers, the rack being moveable and having a down position in which the wafers are submerged in the DIW for washing and having an up position in which the wafers are in the upper portion of the housing and entirely out of the DIW in the wash tank for drying;

means for slowly raising the rack from its down position to its up position, the rate of raising being slow enough that surface details of the ICs can be substantially entirely freed of trapped DIW;

vapor means for supplying organic vapor to the upper portion of the housing, the vapor being of an organic liquid which has a lower surface tension than the surface tension of DIW, the DIW being drawn down away from surface details of the ICs by an enhanced "Marangoni effect" fluid flow when the wafers are raised by the rack out of the DIW in the wash tank and the formation of watermarks is substantially eliminated; and pump means for reducing gas pressure within the housing to a value substantially below atmospheric pressure during drying of the wafers in the upper portion of the housing.

3. The apparatus of claim 2 wherein the cooling means also cools the organic vapor to about 5° C.

4. The apparatus of claim 2 wherein the pump means lowers the pressure within the housing during drying to about one Torr, the pressure in the housing during washing of the wafers being atmospheric.

5. The apparatus of claim 2 wherein the means for slowly raising the rack does so during an elapsed time of 5 to 10 minutes.

6. The apparatus of claim 2 wherein the vapor means supplies IPA vapor in nitrogen, and the vapor means is turned off during drying of the wafers.

7. Apparatus for washing in de-ionized water (DIW), and then drying in vacuum, semiconductor wafers having thereon integrated circuits (ICs) which have microscopically fine surface details, the apparatus comprising:

a housing having upper and lower portions, the housing being hermetically sealed during drying of the wafers;

a wash tank located in the lower portion of the housing with a top of the tank being open to the upper portion of the housing;

water supply means for supplying de-ionized water (DIW) to the bottom of the tank, the DIW flowing continuously into and up within the tank and overflowing the top thereof, the DIW washing a wafer or wafers submerged in the tank;

a wafer holding member within the housing for holding a wafer or wafers, the member being moveable and having a lowered position in which the wafers are submerged in the DIW for washing and having a fully raised position in which the wafers are in the upper portion of the housing for drying and entirely out of the DIW in the wash tank;

means for raising the wafer holding member from its lowered position to its fully raised position, the rate of raising being selected such that the surface details on the ICs are substantially entirely freed of residual DIW;

vapor means for supplying vaporized liquid in inert gas to the upper portion of the housing while the wafers are being raised out of the DIW wash tank, the liquid which has a lower surface tension than the surface tension of DIW so that the DIW is drawn down away from surface details on the ICs by "Marangoni effect" fluid flow when the wafers are raised out of the DIW in the wash tank, and the formation of watermarks on the ICs is substantially entirely eliminated;

pump means for reducing the pressure within the housing to a value substantially below atmospheric pressure during drying of the wafers in the upper portion of the housing, the pressure in the housing during washing of the wafers being at atmospheric; and cooling means for chilling to about 5° C. the DIW and the vaporized liquid in inert gas such that the "Marangoni effect" is enhanced.

8. The apparatus of claim 7 wherein the pump means reduces the pressure in the housing during drying to about one Torr.

9. The apparatus of claim 7 wherein the means for raising the wafer holding member takes an elapsed time of 5 to 10 minutes in raising the member from its lowered position to its fully raised position.

* * * * *